(12) United States Patent
Kim et al.

(10) Patent No.: US 9,780,183 B2
(45) Date of Patent: Oct. 3, 2017

(54) SEMICONDUCTOR DEVICES HAVING WORK FUNCTION METAL FILMS AND TUNING MATERIALS

(71) Applicants: Wan-Don Kim, Yongin-si (KR); Oh-Seong Kwon, Hwaseong-si (KR); Hoon-Joo Na, Hwaseong-si (KR); Hyeok-Jun Son, Seoul (KR); Jae-Yeol Song, Seoul (KR); Sung-Kee Han, Seoul (KR); Sang-Jin Hyun, Suwon-si (KR)

(72) Inventors: Wan-Don Kim, Yongin-si (KR); Oh-Seong Kwon, Hwaseong-si (KR); Hoon-Joo Na, Hwaseong-si (KR); Hyeok-Jun Son, Seoul (KR); Jae-Yeol Song, Seoul (KR); Sung-Kee Han, Seoul (KR); Sang-Jin Hyun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/989,154

(22) Filed: Jan. 6, 2016

(65) Prior Publication Data

US 2016/0225868 A1    Aug. 4, 2016

(30) Foreign Application Priority Data

Feb. 3, 2015   (KR) .................. 10-2015-0016621

(51) Int. Cl.
*H01L 29/49*    (2006.01)
*H01L 27/088*   (2006.01)
(Continued)

(52) U.S. Cl.
CPC .... *H01L 29/4966* (2013.01); *H01L 21/82345* (2013.01); *H01L 21/823462* (2013.01);
(Continued)

(58) Field of Classification Search
CPC .................................................. H01L 29/4966
See application file for complete search history.

(56) References Cited

U.S. PATENT DOCUMENTS 8,212,322 B2 * 7/2012 Frank ..................... H01L 27/11
257/391
8,252,649 B2   8/2012 Stahrenberg et al.
(Continued)

FOREIGN PATENT DOCUMENTS

JP    2006-41339 A      2/2006
KR    10-2012-0125017 A   11/2012

*Primary Examiner* — Eugene Lee
(74) *Attorney, Agent, or Firm* — Myers Bigel, P.A.

(57) ABSTRACT

A semiconductor device includes a first transistor comprising a first dielectric film on a substrate and a first work function metal film of a first conductivity type on the first dielectric film, a second transistor comprising a second dielectric film on the substrate and a second work function metal film of the first conductivity type on the second dielectric film, and a third transistor comprising a third dielectric film on the substrate and a third work function metal film of the first conductivity type on the third dielectric film. The first dielectric film comprises a work function tuning material and the second dielectric film does not comprise the work function tuning material. The first work function metal film has different thickness than the third work function metal film. Related methods are also described.

20 Claims, 24 Drawing Sheets

(51) Int. Cl.
    *H01L 29/423*    (2006.01)
    *H01L 21/8234*   (2006.01)
(52) U.S. Cl.
    CPC ...... *H01L 27/0886* (2013.01); *H01L 29/4238* (2013.01); *H01L 29/42364* (2013.01); *H01L 21/823431* (2013.01)

(56) References Cited

U.S. PATENT DOCUMENTS

| | | |
|---|---|---|
| 8,354,309 B2 | 1/2013 | Greene et al. |
| 8,357,604 B2 | 1/2013 | Hoentschel et al. |
| 8,653,611 B2 | 2/2014 | Ji et al. |
| 2012/0280330 A1 | 11/2012 | Lee et al. |
| 2012/0313178 A1* | 12/2012 | Liao ................. H01L 29/66545 257/368 |
| 2014/0117466 A1 | 5/2014 | Jagannathan et al. |
| 2014/0220770 A1 | 8/2014 | Stahrenberg et al. |
| 2015/0004779 A1* | 1/2015 | Zhu ....................... H01L 21/022 438/592 |
| 2015/0187763 A1* | 7/2015 | Kim ..................... H01L 27/088 257/392 |
| 2016/0104786 A1* | 4/2016 | Yang .................. H01L 29/4966 257/369 |

\* cited by examiner

SEMICONDUCTOR DEVICES HAVING WORK FUNCTION METAL FILMS AND TUNING MATERIALS

This application claims priority from Korean Patent Application No. 10-2015-0016621 filed on Feb. 3, 2015 in the Korean Intellectual Property Office, and all the benefits accruing therefrom under 35 U.S.C. 119, the contents of which in its entirety are herein incorporated by reference.

BACKGROUND

The present disclosure relates to semiconductor devices and methods of fabricating the same. More specifically, the present disclosure relates to semiconductor devices utilizing a three-dimensional channel, and methods of fabricating the same.

As a scaling technique to increase the density of semiconductor devices, a multi gate transistor has been proposed in which a silicon body having a fin- or nanowire-shape is formed on a substrate, and gates are formed on the surface of the silicon body.

It may be easy to scale such multi gate transistors since they utilize three-dimensional channels. In addition, it is possible improve current control capability without increasing the gate length of such multi gate transistors. Further, the short-channel effect (SCE) that refers to the influence on the potential at a channel region by a drain voltage can be effectively suppressed.

As semiconductor devices become more integrated, the width of fins or nanowires may be limited. Therefore, adjusting channel implant or source/drain implant may have limited influence on threshold voltages (Vth) of multi gate transistors.

SUMMARY

Aspects of the present disclosure can provide semiconductor devices that can have different threshold voltages.

Aspects of the present disclosure also can provide methods of fabricating semiconductor devices that can have different threshold voltages.

According to an aspect of the present disclosure, there is provided a semiconductor device including a first fin-type transistor comprising a first fin, a first trench on the first fin, a first dielectric film extending along inner walls of the first trench and a first work function metal film on the first dielectric film in the first trench, the first work function metal film being of a first conductivity type; a second fin-type transistor comprising a second fin, a second trench on the second fin, a second dielectric film extending along inner walls of the second trench and a second work function metal film on the second dielectric film in the second trench, the second work function metal film being of the first conductivity type; and a third fin-type transistor comprising a third fin, a third trench on the third fin, a third dielectric film extending along inner walls of the third trench and a third work function metal film on the third dielectric film in the third trench, the third work function metal film being of the first conductivity type. The first dielectric film comprises a work function tuning material and the second dielectric film does not comprise the work function tuning material, and in some embodiments comprises no work function tuning material. Moreover, a first thickness of the first work function metal film is different from a third thickness of the third work function metal film.

According to another aspect of the present disclosure, there is provided a semiconductor device including a first fin-type transistor comprising a first fin, a first trench on the first fin, a first dielectric film extending along inner walls of the first trench and a first work function metal film in the first trench, the first work function metal film being of a second conductivity type; a second fin-type transistor comprising a second fin, a second trench on the second fin, a second dielectric film extending along inner walls of the second trench and a second work function metal film in the second trench, the second work function metal film being of the second conductivity type; and a third fin-type transistor comprising a third fin, a third trench on the third fin, a third dielectric film extending along inner walls of the third trench and a third work function metal film and a fourth work function metal film sequentially in the third trench, the third work function metal film being of a first conductivity type and the fourth work function metal film being of the second conductivity type. A work function metal film of the first conductivity type is not disposed between the first dielectric film and the first work function metal film and between the second dielectric film and the second work function metal film. The first dielectric film comprises a work function tuning material and the second dielectric film does not comprise the work function tuning material.

According to still another aspect of the present disclosure, there is provided a semiconductor device including a first fin-type transistor comprising a first fin, a first trench on the first fin, a first dielectric film extending along inner walls of the first trench and a first work function metal film in the first trench, the first work function metal film being of a first conductivity type; a second fin-type transistor comprising a second fin, a second trench on the second fin, a second dielectric film extending along inner walls of the second trench and a second work function metal film in the second trench, the second work function metal film being of the first conductivity type; and a third fin-type transistor comprising a third fin, a third trench on the third fin, a third dielectric film extending along inner walls of the third trench and a third work function metal film in the third trench, the third work function metal film being of the first conductivity type. An oxygen concentration in the first work function metal film is lower than an oxygen concentration in the second work function metal film. A first thickness of the first work function metal film is different from a third thickness of the third work function metal film.

According to still another aspect of the present disclosure, there is provided a semiconductor device comprising a substrate; a first transistor on the substrate, the first transistor comprising a first gate dielectric film and a first work function metal film on the first gate dielectric film, the first work function metal film being of a first conductivity type; a second transistor on the substrate, the second transistor comprising a second gate dielectric film and a second work function metal film on the second dielectric film, the second work function metal film being of the first conductivity type; and a third transistor on the substrate, the third transistor comprising a third gate dielectric film and a third work function metal film on the third gate dielectric film, the third work function metal film being of the first conductivity type. The first gate dielectric film comprises a work function tuning material and the second gate dielectric film does not comprise the work function tuning material, and in some embodiments comprises no work function tuning material. A first thickness of the first work function metal film is different from a third thickness of the third work function metal film.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
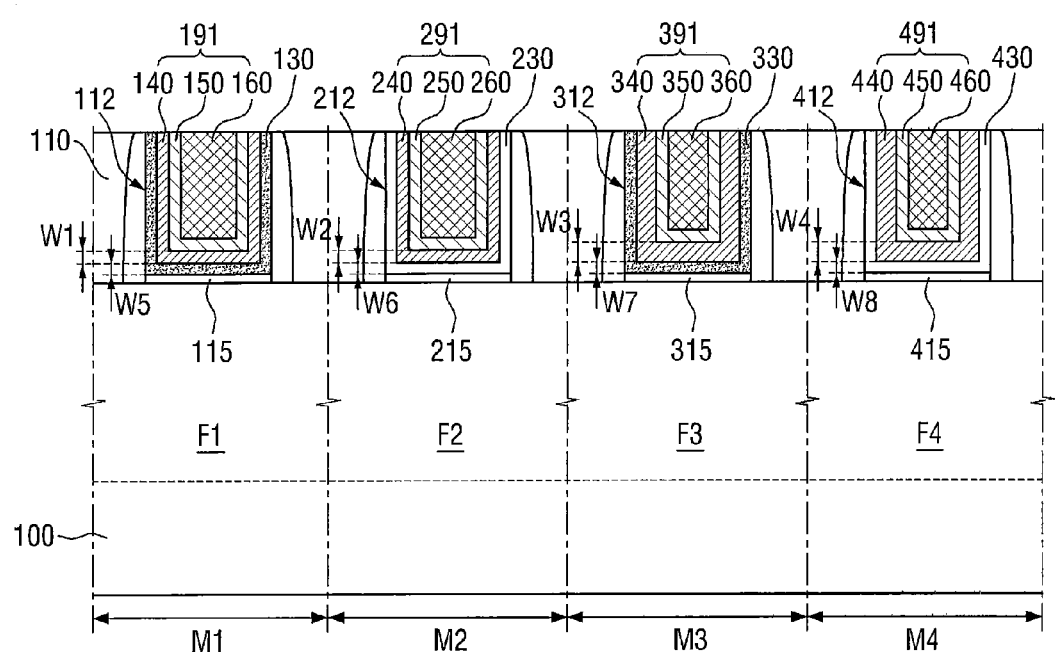
FIG. 1 is a cross-sectional view for illustrating a semiconductor device according to an example embodiment of the present disclosure.

Advantages and features of the present disclosure and methods of accomplishing the same may be understood more readily by reference to the following detailed description of various embodiments and the accompanying drawings. The present disclosure may, however, be embodied in many different forms and should not be construed as being limited to the embodiments set forth herein. Rather, these embodiments are provided so that this disclosure will be thorough and complete and will fully convey the present disclosure to those skilled in the art, and the present inventive concepts will only be defined by the appended claims. Like reference numerals refer to like elements throughout the specification.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises", "comprising,", "includes", "including", "have" and/or "having", and variants thereof when used in this specification, specify the presence of stated features, steps, operations, elements, and/or components, but do not preclude the presence or addition of one or more other features, steps, operations, elements, components, and/or groups thereof.

It will be understood that when an element or layer is referred to as being "on", "connected to" or "coupled to" another element or layer (or variants thereof), it can be directly on, connected or coupled to the other element or layer or intervening elements or layers may be present. In contrast, when an element is referred to as being "directly on", "directly connected to" or "directly coupled to" another element or layer (or variants thereof), there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
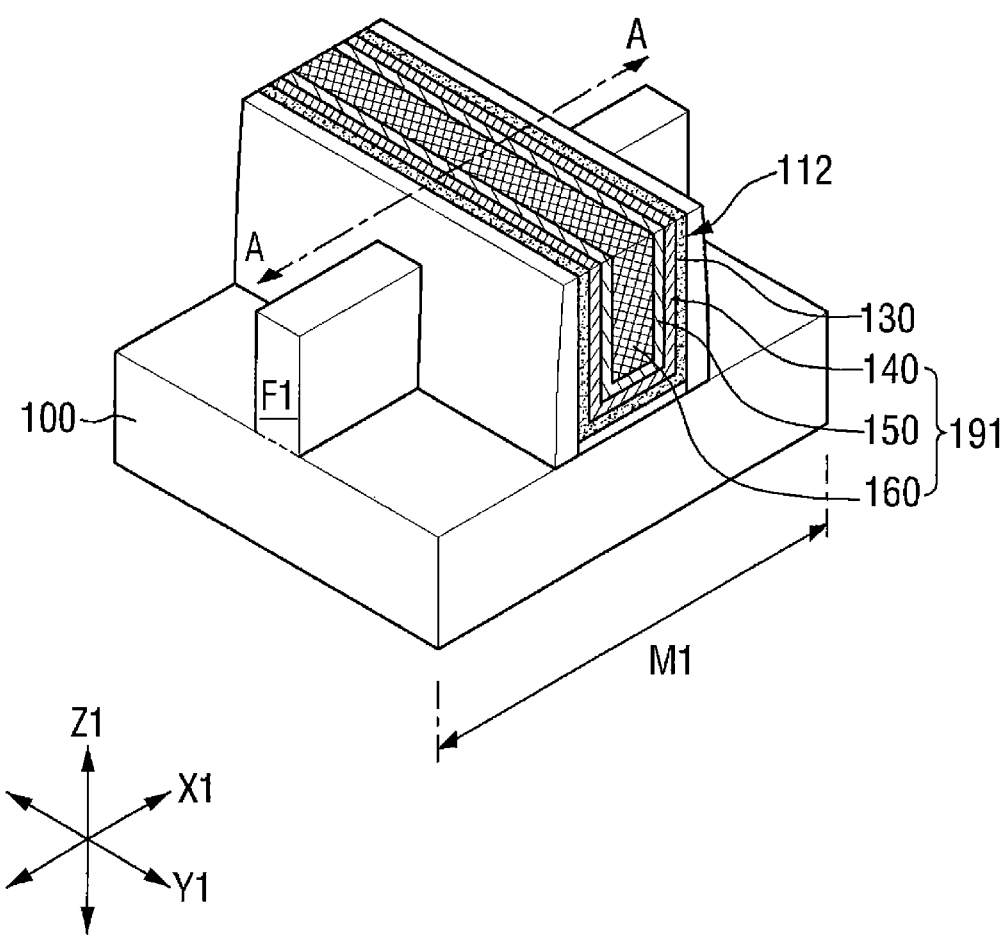
FIG. 2 is a perspective view of a first fin-type transistor M1 of FIG. 1.
Figure 3:
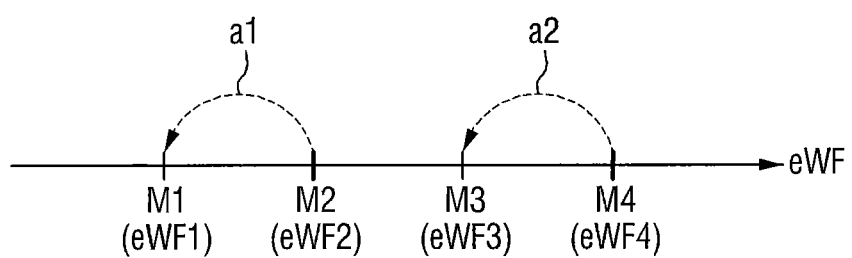
FIG. 3 is a conceptual diagram for illustrating an effect of the semiconductor device of FIG. 1.

FIG. 1 is a cross-sectional view for illustrating a semiconductor device according to an example embodiment of the present disclosure. FIG. 2 is a perspective view of a first fin-type transistor M1 of FIG. 1. FIG. 3 is a conceptual diagram for illustrating an effect of the semiconductor device of FIG. 1.

Referring to FIG. 1, a semiconductor device according to the first example embodiment of the present disclosure may include first to fourth fin-type transistors M1 to M4 formed on a substrate 100. The first to fourth fin-type transistors M1 to M4 may be fin-type transistors utilizing three-dimensional channels, such as fin-type field effect transistor (FinFET). In addition, the first to fourth fin-type transistors M1 to M4 may be of the same conductivity type (e.g., n-type or p-type). In other embodiments, however, fin-type transistors need not be used. Rather, conventional FETs having source/drain regions, a channel region therebetween, and a gate on the channel region, may be used.

The first fin-type transistor M1 will be described at first with reference to FIGS. 1 and 2. The first fin-type transistor M1 includes a first fin F1, a first interface film 115, a first dielectric film 130 and a first metal gate 191. The first metal gate 191 may include a first work function metal film 140 of a first conductivity type (e.g., p-type), an eleventh work function metal film 150 of a second conductivity type (e.g., n-type), and a conductive pattern 160.

The first fin F1 may be extended in a first direction X1 on the substrate 100.

The first fin F1 may be a part of the substrate 100 and may include an epitaxial layer which has been grown on the substrate 100.

The first fin F1 may include silicon and/or germanium, which are single-element semiconductor materials. In addition, the first fin F1 may include compound semiconductors, such as an IV-IV group compound semiconductor and/or an III-V group compound semiconductor. Specifically, as examples of IV-IV group compound semiconductors, the first fin F1 may be a binary compound or ternary compound including at least two of carbon (C), silicon (Si), germanium (Ge) and tin (Sn), or such compound doped with IV group element. As examples of group compound semiconductor, the first fin F1 may be a binary compound, ternary compound or quaternary compound formed by bonding at least one of aluminum (Al), gallium (Ga) and indium (In) as III group element and one of phosphorous (P), arsenic (As) and antimony (Sb) as V group element.

An interlayer insulation film 110 is disposed on the substrate 100. A first trench 112 is formed in the interlayer insulation film 110. The first trench 112 may be extended in a second direction Y1 different from the first direction X1. For example, the first direction X1 may be perpendicular to the second direction Y1.

The first interface film 115 is formed in the first trench 112. As shown in the drawings, the first interface film 115 may be formed only on the bottom in the first trench 112. The first interface film 115 may include silicon oxide film. The first interface film 115 may be formed by using chemical oxidation, UV oxidation and/or dual plasma oxidation, for example.

The first dielectric film 130 may be formed along inner walls of the first trench 112. Specifically, the first dielectric film 130 may be formed on two side walls and on the bottom surface. The first dielectric film 130 may be formed by chemical vapor deposition (CVD) and/or atomic layer deposition (ALD), for example. The first dielectric film 130 may include a high-k dielectric insulation film comprising, e.g., hafnium (Hf) and/or zirconium (Zr). Specifically, the first dielectric film may include, but is not limited to, hafnium oxide, hafnium silicon oxide, hafnium oxynitride, zirconium oxide, zirconium silicon oxide, tantalum oxide, titanium oxide, barium strontium titanium oxide, barium titanium oxide, strontium titanium oxide, yttrium oxide, lead scandium tantalum oxide and/or lead zinc niobate.

The first work function metal film 140 of the first conductivity type may be formed on the first dielectric film 130 in the first trench 112. The first work function metal film 140 may be formed on the side walls and the bottom surface of the first trench 112. The first work function metal film 140 may be formed by chemical vapor deposition (CVD) and/or atomic layer deposition (ALD), for example. For example, the first work function metal film 140 may include, but is not limited to, binary metal nitride such as TiN and/or TaN; ternary metal nitride such as TiAlN, TaAlN, TiSiN and/or TaSiN; and/or oxides thereof.

The eleventh work function metal film 150 of the second conductivity type (e.g., n-type) may be formed on the first work function metal film 140 in the first trench 112. The eleventh work function metal film 150 may be formed on the side walls and the bottom surface of the first trench 112. The eleventh work function metal film 150 may be formed by chemical vapor deposition (CVD) and/or atomic layer deposition (ALD), for example. For example, the eleventh work function metal film 150 may include, but is not limited to, binary metal material containing Al element and/or another metal element and/or oxide, nitride and/or carbide thereof, such as TiAlC, TiAlN, TiAlC—N and/or TiAl, etc. and TaAlC, TaAlN, TiAlC—N and/or TaAl.

The conductive pattern 160 may be formed on the eleventh work function metal film 150, and in some embodiments to fill the first trench 112. The conductive pattern 160 may be, but is not limited to, aluminum (Al) and/or tungsten (W).

Although not shown in the drawings, a layer made of a material for enhancing adhesion between the eleventh work function metal film 150 and the conductive pattern 160 may be formed. The layer may include TiN and/or Ti, for example.

The second fin-type transistor M2 includes a second fin F2, a second trench 212, a second interface film 215, a second dielectric film 230 and a second metal gate 291. The second metal gate 291 may include a second work function metal film 240 of a first conductivity type (e.g., p-type), a twelfth work function metal film 250 of a second conductivity type (e.g., n-type), and a conductive pattern 260.

The third fin-type transistor M3 includes a third fin F3, a third trench 312, a third interface film 315, a third dielectric film 330 and a third metal gate 391. The third metal gate 391 may include a third work function metal film 340 of a first conductivity type (e.g., p-type), a thirteenth work function metal film 350 of a second conductivity type (e.g., n-type), and a conductive pattern 360.

The fourth fin-type transistor M4 includes a fourth fin F4, a fourth trench 412, a fourth interface film 415, a fourth dielectric film 430 and a fourth metal gate 491. The fourth metal gate 491 may include a fourth work function metal film 440 of a first conductivity type (e.g., p-type), an fourteenth work function metal film 450 of a second conductivity type (e.g., n-type), and a conductive pattern 460.

The first to fourth fins F1 to F4 may be made of the same material and may have the same thickness. The first to fourth interface films 115 to 415 may be made of the same material. The first to fourth work function metal films 140 to 440 may be made of the same material. The eleventh to fourteenth work function metal film 150 to 450 may be made of the same material. However, this is merely illustrative.

In the semiconductor device according to this example embodiment of the present disclosure, the first to fourth fin-type transistors M1 to M4 may have different threshold voltages.

Due to ever-decreasing design rule, the size, e.g., width, of fins may become smaller. When dopants are implanted into the fins of small size, a change in the threshold voltage is small. To change the threshold voltage sufficiently, dopants in high concentration have to be implanted into the fins. If dopants in high concentration are implanted, however, mobility may be deteriorated and thus performance may be degraded.

In the semiconductor device according to the above-described example embodiment of the present disclosure, by way of adjusting thickness of at least some of the first to fourth work function metal films 140 to 440, and by way of doping work function tuning material into at least some of the first to fourth dielectric films 130 to 430, the first to fourth work function metal films 140 to 440 have different effective work functions. By doing so, the threshold voltages of the first to fourth fin-type transistors M1 to M4 can be adjusted.

The work function of the work function metal film of the first conductivity type may be changed depending on the thickness of the work function metal film of the first conductivity type (p-type) under the work function metal film of the second conductivity type (n-type). For example, assuming that the work function changes relative to the thickness of a p-type work function metal film at the rate of about 10 mV/Å, in order to obtain a relatively small change of about 50 mV in the threshold voltage, the thickness of the p-type work function metal film needs to be changed by about 5 Å. For example, to make the difference of about 50 mV in the threshold voltage between a transistor A and a transistor B, on the assumption that other conditions are the same, the difference of about 5 Å in the thickness of the work function metal films between the transistor A and the transistor B is required. Unfortunately, such a difference in thickness is so small that there may exist many difficulties in manufacturing processes. For example, it may be difficult to make such a difference in thickness by deposition or patterning. In addition, when patterning a p-type work function tuning film having a small thickness, e.g., of about 5 Å, a dielectric film under the p-type work function metal film may be damaged. Such damage may result in leakage current or low reliability. Therefore, tuning work function by adjusting thickness of a work function metal film can be applied for tuning a relatively large work function. This scheme may be employed, for example, when a difference in work function between a transistor A and a transistor B is above about 80 mV (i.e., a difference in thickness of a p-type work function metal film between the transistor A and the transistor B is larger than about 8 Å).

As another scheme, it is possible to change the effective work function of a work function metal film by doping a work function tuning material into a dielectric film (a high-k insulation film). For example, by forming a layer of La and/or LaO on a dielectric film and performing drive-in annealing, the work function tuning material (La) can be diffused in the dielectric film. Once the work function tuning material (La) is diffused, the effective work function of a work function metal film can be decreased. Alternatively, by forming a layer of Al and/or AlO on a dielectric film and performing drive-in annealing, the work function tuning material (Al) can be diffused in the dielectric film. Once the work function tuning material (Al) is diffused, the effective work function of a work function metal film can be increased. The work function tuning material (La and/or Al) forms dipoles in the dielectric film, so that the effective work function of the work function metal film is changed.

However, to change the effective work function more than about 60 mV in this approach, a great amount of work function tuning material (La and/or Al) has to be diffused. If a great amount of the work function tuning material is diffused, defect or charge may occur so that mobility may be lowered. As a result, reliability may be degraded.

Therefore, the scheme of tuning work function by doping work function tuning material into a dielectric film (high-k insulation film) can be applied for tuning a work function in a relatively small range. This scheme, for example, can be employed for making a difference of about 60 mV or less in work function between a transistor A and a transistor B.

In short, it is difficult to make a small difference in work function only by adjusting thickness of a work function metal film. On the other hand, it is difficult to make a large difference in work function only by doping tuning material. Therefore, both of the two schemes may be used to make a difference in work function in order to produce fin-type or other transistors with work functions having various values.

In addition, as mentioned earlier, implanting dopant in high concentration into a considerably small fin may result in deterioration in mobility. For this reason, in the second device according to the above-described example embodiment of the present disclosure, no additional dopant is implanted into a fin to change the threshold voltage. Namely, dopants of the same concentration may be implanted into the first to fourth fins F1 to F4. Specifically, source/drain ions of the same concentration are doped into the first to fourth fins F1 to F4. Or, no additional halo ion is doped into the first to fourth fins F1 to F4. By applying the above-described approaches (adjusting thicknesses of the work function metal films and doping the work function tuning material) to the four fins F1 to F4 having the same dopant concentration, the threshold voltages of the four fin-type transistors M1 to M4 can be adjusted so that they are different from one another.

Hereinafter, an example method of adjusting threshold voltages will be described with reference to FIGS. 1 and 3 and Table 1.

The thickness W1 of the first work function metal film 140 is substantially equal to the thickness W2 of the second work function metal film 240.

On the other hand, a work function tuning material e.g., La is doped (or contained) in the first dielectric film 130 whereas no work function tuning material is doped (or contained) in the second dielectric film 230. Accordingly, as shown in FIG. 3, the effective work function of the second work function metal film 240 remains at eWF2 while the effective work function of the first work function metal film 140 shifts from eWF2 to eWF1 (as indicated by symbol a1).

Similarly, the thickness W3 of the third work function metal film 340 is substantially equal to the thickness W4 of the fourth work function metal film 440. The thicknesses W3 and W4 are larger than the thicknesses W1 and W2.

In addition, a work function tuning material e.g., La is doped in the third dielectric film 330 whereas no work function tuning material is doped (or contained) in the fourth dielectric film 430. Accordingly, as shown in FIG. 3, the effective work function of the fourth work function metal film 440 remains at eWF4 while the effective work function of the third work function metal film 340 shifts from eWF4 to eWF3 (as indicated by symbol a2).

The difference between eWF2 and eWF4 is made by the difference in thicknesses between the second work function metal film 240 and the fourth work function metal film 440. Therefore, the difference between eWF2 and eWF4 may be equal to or larger than about 80 mV.

Further, the difference between eWF2 and eWF1 and the difference between eWF4 and eWF3 are made depending on whether the work function tuning material is doped (contained). Therefore, the difference between eWF2 and eWF1 and the difference between eWF4 and eWF3 may be equal to or less than about 60 mV, respectively.

Consequently, the levels of the first to fourth work function metal films 140 to 440 have the following relationship: eWF1<eWF2<eWF3<eWF4.

As a result, the threshold voltages of the first to fourth fin-type transistors M1 to M4 can be adjusted so that they are different from one another. It is to be noted that the threshold voltages may be adjusted differently depending on whether the first to fourth fin-type transistors M1 to M4 are NMOS or PMOS transistors. It is easy to obtain various levels of threshold voltages even for a considerably small fin.

TABLE 1

| Fin-type transistors | M1 | M2 | M3 | M4 |
|---|---|---|---|---|
| Thickness of Work Function Metal Film of First Type (p-type) | W1 | W2(=W1) | W3 | W4(=W3) |
| Doping of Work Function Tuning Material (La) | Y | N | Y | N |
| Effective Work Function of Work Function Metal Film of First Type (p-type) | eWF1 | eWF2 | eWF3 | eWF4 |
| | | eWF1 < eWF2 < eWF3 < eWF4 | | |

As described above, by forming a LaO layer on the first and third dielectric films 130 and 330 and performing drive-in annealing, the work function tuning material (La) can be diffused in the first and third dielectric films 130 and 330. Since no LaO layer is formed on the second and fourth dielectric films 230 and 430, the work function tuning material (La) is not diffused in the second and fourth dielectric films 230 and 430. Due to the layer of La and/or LaO used for diffusing the work function tuning material (La), the thickness W5 of the first dielectric film 130 and the thickness W7 of the third dielectric 330 may be larger than the thickness W6 of the second dielectric film 230 and the thickness W8 of the fourth dielectric film 430.

Figure 4:
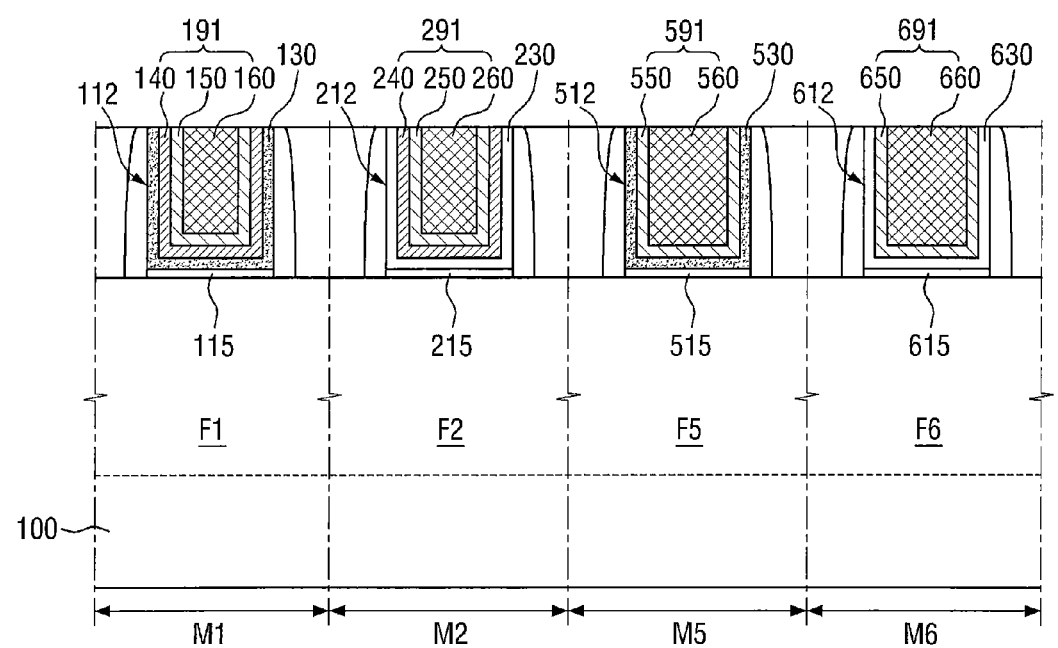
FIG. 4 is a cross-sectional view for illustrating a semiconductor device according to another example embodiment of the present disclosure.

FIG. 4 is a cross-sectional view for illustrating a semiconductor device according to another example embodiment of the present disclosure. For convenience of illustration, descriptions will be made focusing on the differences from those described above with respect to FIGS. 1 to 3.

Referring to FIG. 4, the semiconductor device according to this example embodiment of the present disclosure may include a first fin-type transistor M1, a second fin-type transistor M2, a fifth fin-type transistor M5 and a sixth fin-type transistor M6 formed on a substrate 100.

The fifth fin-type transistor M5 includes a fifth fin F5, a fifth trench 512, a fifth interface film 515, a fifth dielectric film 530 and a fifth metal gate 591. The fifth metal gate 591 may include a fifth work function metal film 550 of a second conductivity type (e.g., n-type), and a conductive pattern 560. The fifth fin-type transistor M5 may not have a work function metal film of a first conductivity type (e.g., p-type) between the fifth dielectric film 530 and the fifth work function metal film 550.

The sixth fin-type transistor M6 includes a sixth fin F6, a sixth interface film 612, a sixth dielectric film 615 and a sixth metal gate 691. The sixth metal gate 691 may include a sixth work function metal film 650 of a second conductivity type (e.g., n-type), and a conductive pattern 660. The sixth fin-type transistor M6 may not have a work function metal film of a first conductivity type (e.g., p-type) between the sixth dielectric film 615 and the sixth work function metal film 650.

A work function tuning material may be doped (or contained) in the fifth interface film 515 whereas no work function tuning material may be doped (or contained) in the sixth interface film 615.

Figure 5:
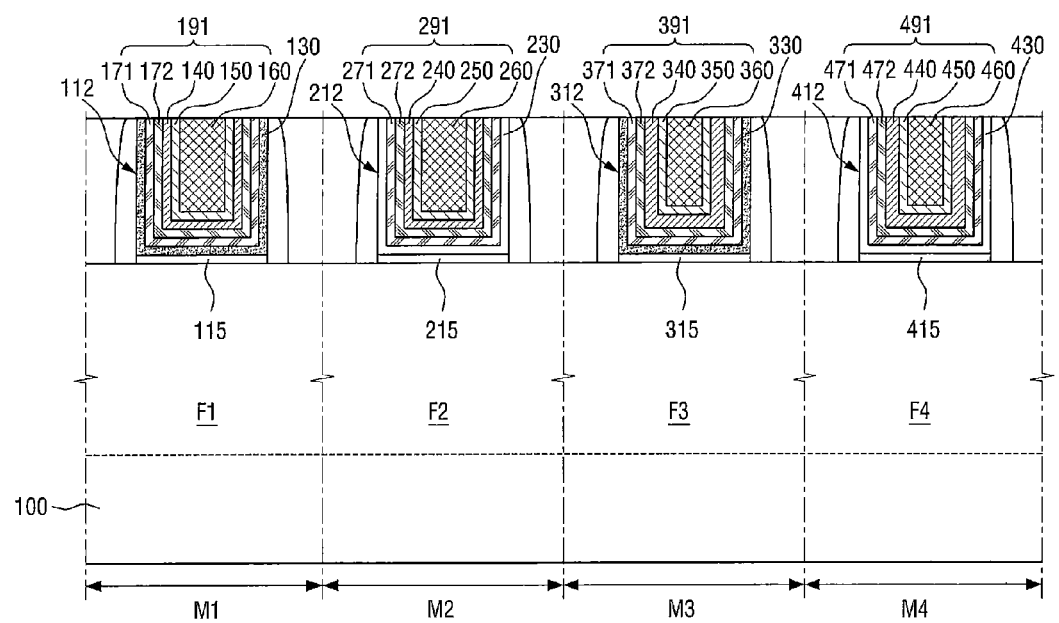
FIG. 5 is a cross-sectional view for illustrating a semiconductor device according to another example embodiment of the present disclosure.

FIG. 5 is a cross-sectional view for illustrating a semiconductor device according to another example embodiment of the present disclosure. For convenience of illustration, descriptions will be made focusing on the differences from those described above with respect to FIGS. 1 to 3.

Referring to FIG. 5, the semiconductor device according to this example embodiment of the present disclosure may include first to fourth fin-type transistors M1 to M4 formed on a substrate 100.

In the first fin-type transistor M1, a first protection film 171 and a first etch stop layer 172 may be disposed in this order between the first dielectric film 130 and the first work function metal film 140.

The first protection film 171 serves to protect the first dielectric film 130 at the time of patterning. The first protection film 171 may comprise, but is not limited to, TiN. The first etch stop layer 172 serves as a barrier to stop etching at the time of patterning. The first etch stop layer film 172 may comprise, but is not limited to, TaN.

Similarly, in the second fin-type transistor M2, a second protection film 271 and a second etch stop layer 272 may be disposed in this order between the second dielectric film 230 and the second work function metal film 240. In the third fin-type transistor M3, a third protection film 371 and a third etch stop layer 372 may be disposed in this order between the third dielectric film 330 and the third work function metal film 340. In the fourth fin-type transistor M4, a fourth protection film 471 and a fourth etch stop layer 472 may be disposed in this order between the fourth dielectric film 430 and the fourth work function metal film 440.

Figure 6:
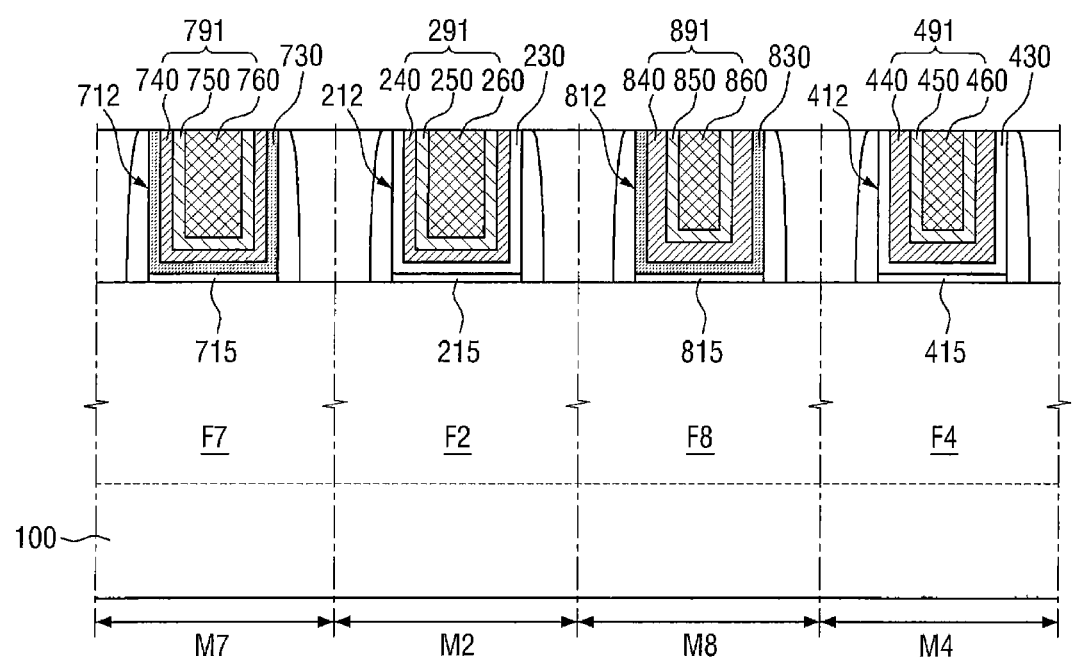
FIG. 6 is a cross-sectional view for illustrating a semiconductor device according to another example embodiment of the present disclosure.

FIG. 6 is a cross-sectional view for illustrating a semiconductor device according to another example embodiment of the present disclosure. For convenience of illustration, descriptions will be made focusing on the differences from those described above with respect to FIGS. 1 to 3.

Referring to FIG. 6, in the semiconductor device according to this example embodiment of the present disclosure, a seventh dielectric film 730 of a seventh fin-type transistor M7 and an eighth dielectric film 830 of an eighth fin-type transistor M8 may be doped with work function tuning material of Al, instead of La.

Namely, although a thickness of the first work function metal film 740 is equal to a thickness of the second work function metal film 240, the seventh dielectric film 730 is doped with the work function tuning material (Al) whereas the second dielectric film 230 is not doped with the work function tuning material. Accordingly, the effective work function of the first work function metal film 740 may be larger than the effective work function of the second work function metal film 240.

Similarly, although a thickness of the third work function metal film 840 is equal to a thickness of the fourth work function metal film 440, the eighth dielectric film 830 is doped with the work function tuning material (Al) whereas the fourth dielectric film 430 is not doped with the work function tuning material. Accordingly, the effective work function of the third work function metal film 840 may be larger than the effective work function of the fourth work function metal film 440.

The seventh fin-type transistor M7 also includes a trench 712, an interface film 715, a work function metal film 750 of the second conductivity type (n-type), a conductive pattern 760 and a metal gate 791. Likewise, the eighth fin-type transistor M8 also includes a trench 812, an interface film 815, a work function metal film 850 of the second conductivity type (n-type), a conductive pattern 860 and a metal gate 891.

Figure 7:
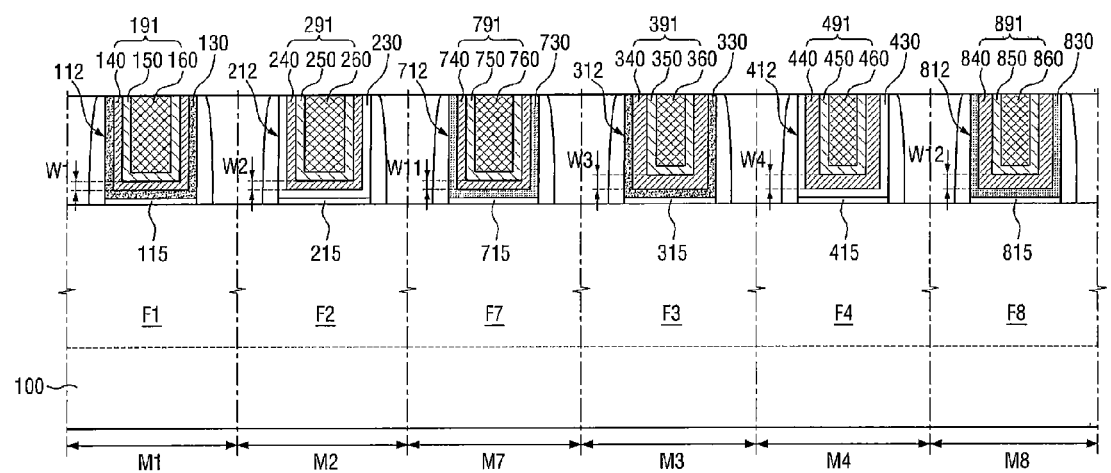
FIGS. 7 and 8 are views for illustrating a semiconductor device according to another example embodiment of the present disclosure.
Figure 8:
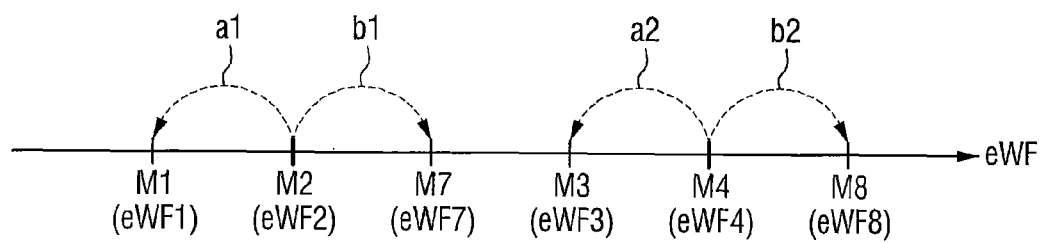

FIGS. 7 and 8 are views for illustrating a semiconductor device according to another example embodiment of the present disclosure. For convenience of illustration, descriptions will be made focusing on the differences from those described above with respect to FIGS. 1 to 3 and FIG. 6.

Referring to FIGS. 7 and 8 and Table 2, in the semiconductor device according to this example embodiment of the present disclosure, La and Al can be used together as the work function tuning material.

Specifically, the first dielectric film 130 of the first fin-type transistor M1 is doped with La. The second dielectric film 230 of the second fin-type transistor M2 is doped with neither of La and Al. The seventh dielectric film 730 of the seventh fin-type transistor M7 is doped with Al. Further, the thicknesses W1, W2 and W11 of the first fin-type transistor M1, the second fin-type transistor M2 and the seventh fin-type transistor M7, respectively, are substantially equal to one another. Accordingly, as shown in FIG. 8, the effective work function of the second work function metal film 240 remains at eWF2 while the effective work function of the first work function metal film 140 shifts from eWF2 to eWF1 (as indicated by symbol a1). The effective work function of the seventh work function metal film 740 is increased from eWF2 to eWF7 (as indicated by symbol b1).

Similarly, the third dielectric film 330 of the third fin-type transistor M3 is doped with La. The fourth dielectric film 430 of the fourth fin-type transistor M4 is doped with neither of La and Al. The eighth dielectric film 830 of the eighth fin-type transistor M8 is doped with Al. The thicknesses W3, W4 and W12 of the third fin-type transistor M3, the fourth fin-type transistor M4 and the eighth fin-type transistor M8, respectively, are substantially t equal to one another. Accordingly, as shown in FIG. 8, the effective work function of the fourth work function metal film 440 remains at eWF4 while the effective work function of the third work function metal film 340 is decreased from eWF4 to eWF3 (as indicated by symbol a2). The effective work function of the eighth work function metal film 840 is increased from eWF4 to eWF8 (as indicated by symbol b2).

TABLE 2

| | Fin-type Transistors | | | | | |
|---|---|---|---|---|---|---|
| | M1 | M2 | M7 | M3 | M4 | M8 |
| Thickness of Work Function Metal Film of First Type (p-type) | W1 | W2 (=W1) | W11 (=W1) | W3 | W4 (=W3) | W12 (=W3) |
| Doping Of Work Function Tuning Material | Y(La) | N | Y(Al) | Y(La) | N | Y(Al) |
| Effective Work Function of Work Function Metal Film of First Type (p-type) | eWF1 | eWF2 | eWF7 | eWF3 | eWF4 | eWF8 |
| | eWF1 < eWF2 < eWF7 < eWF3 < eWF4 < eWF8 | | | | | |

Figure 9:
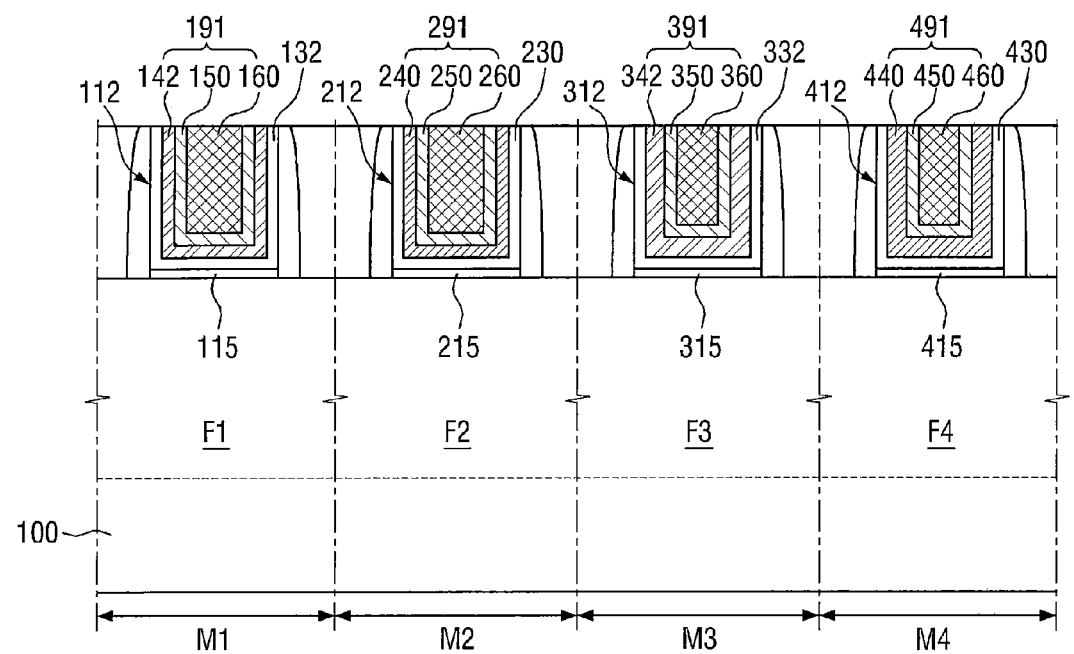
FIG. 9 is a cross-sectional view for illustrating a semiconductor device according to another example embodiment of the present disclosure.

FIG. 9 is a cross-sectional view for illustrating a semiconductor device according to another example embodiment of the present disclosure. For convenience of illustration, descriptions will be made focusing on the differences from those described above with respect to FIGS. 1 to 3.

Referring to FIG. 9, in the semiconductor device according to this example embodiment of the present disclosure, a first work function metal film 142 of a first fin-type transistor M1 and a third work function metal film 342 of a third fin-type transistor M3 may have been subjected to hydrogen plasma doping. On the other hand, a second work function metal film 240 of a second fin-type transistor M2 and a fourth work function metal film 440 of a fourth fin-type transistor M4 may not have been subjected to hydrogen plasma doping.

After having been subjected to the hydrogen plasma doping, impurities (e.g., oxygen and/or chlorine) in the first work function metal film 142 and the third work function metal film 342 can be removed. Specifically, hydrogen reacts with oxygen to yield $H_2O$, and hydrogen reacts with chlorine to yield HCl, so that impurities can be removed. For example, after having subjected to the hydrogen plasma doping, the oxygen impurity content in the first work function metal film 142 and the third work function metal film 342 may be decreased by about 30% to about 90%, and the chlorine impurity content may be decreased by about 20% to about 80%.

When impurities are removed by the hydrogen plasma doping, however, the work functions of the first work function metal film 142 and the third work function metal film 342 may be decreased, and accordingly the flatband voltages may be decreased.

Therefore, even though the first dielectric film 132 and the second dielectric film 232 are not doped with the work function tuning material, the work function of the first work function metal film 142 may be smaller than the work function of the second work function metal film 240 by means of the hydrogen plasma doping. In other words, the threshold voltage of the first fin-type transistor M1 may become lower than the threshold voltage of the second fin-type transistor M2.

Similarly, even though the third dielectric film 332 and the fourth dielectric film 430 are not doped with the work function tuning material, the work function of the third work function metal film 342 may be smaller than the work function of the fourth work function metal film 440 by means of the hydrogen plasma doping. In other words, the threshold voltage of the third fin-type transistor M3 may become lower than the threshold voltage of the fourth fin-type transistor M4.

As described above, the thicknesses of the third work function metal film 342 and the fourth work function metal film 440 are larger than the thicknesses of the first work function metal film 142 and the second work function metal film 240. As a result, the threshold voltages of the first to fourth fin-type transistors M1 to M4 can be adjusted so that they are different from one another.

Figure 10:
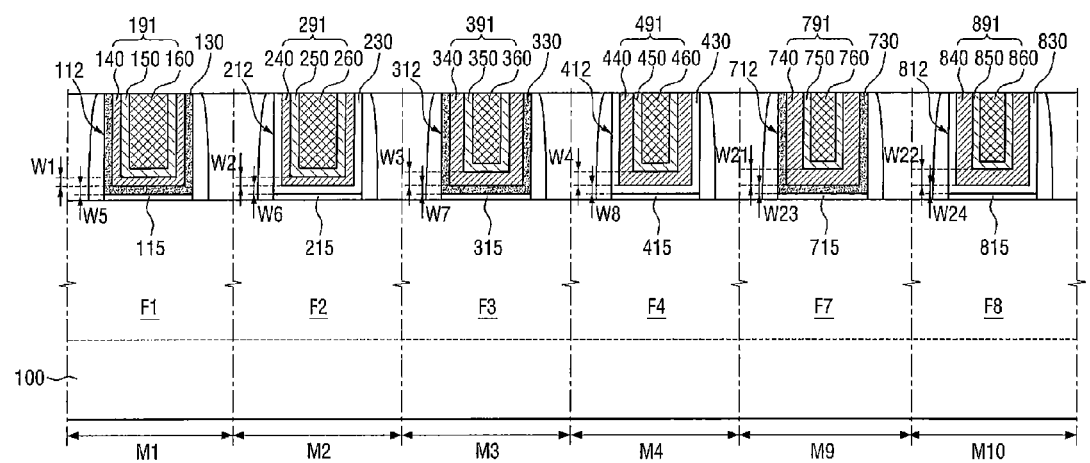
FIG. 10 is a cross-sectional view for illustrating a semiconductor device according to another example embodiment of the present disclosure.

FIG. 10 is a cross-sectional view for illustrating a semiconductor device according to another example embodiment of the present disclosure. For convenience of illustration, descriptions will be made focusing on the differences from those described above with respect to FIGS. 1 to 3.

Referring to FIG. 10, in contrast to the semiconductor device according to the example embodiment in which four fin-type transistors M1 to M4 have different threshold voltages, in the semiconductor device according to the present example embodiment, six fin-type transistors M1 to M4, M9 and M10 have different threshold voltages.

The ninth fin-type transistor M9 includes a seventh fin F7, a trench 712, an interface film 715, a dielectric film 730 and a metal gate 791. The metal gate 791 may include a work function metal film 740 of a first conductivity type (e.g., p-type), a work function metal film 750 of a second conductivity type (e.g., n-type), and a conductive pattern 760.

The tenth fin-type transistor M10 includes an eighth fin F8, a trench 812, an interface film 815, a dielectric film 830 and a metal gate 891. The metal gate 891 may include a work function metal film 840 of a first conductivity type (e.g., p-type), a work function metal film 850 of a second conductivity type (e.g., n-type), and a conductive pattern 860.

A plurality of fins F1 to F4, F7 and F8 may comprise the same material and may have the same thickness. A plurality of interface films 115, 215, 315, 415, 715 and 815 may comprise the same material. A plurality of work function metal films 140, 240, 340, 440, 740 and 840 may comprise the same material. A plurality of work function metal films 150, 250, 350, 450, 750 and 850 may comprise the same material. However, this is merely illustrative.

In the semiconductor device according to this example embodiment of the present disclosure, by way of adjusting thickness of at least some of the work function metal films 140, 240, 340, 440, 740 and 840, and by way of doping work function tuning material into at least some of the dielectric films 130, 230, 330, 430, 730 and 830, the plurality of work function metal films 140, 240, 340, 440, 740 and 840 have different effective work functions. By doing so, the threshold voltages of the six fin-type transistors M1 to M4, M9 and M10 can be adjusted.

In this regard, the thickness relationship among the work function metal films 140, 240, 340, 440, 740 and 840 of the first conductivity type is as follows: W1=W2<W3=W4<W21=W22. In addition, a work function tuning material (La and/or Al) is doped in the plurality of dielectric films 130, 330 and 730 whereas no work function tuning material (La and/or Al) is doped in the plurality of dielectric films 230, 430 and 830.

Additionally, by forming a layer of La and/or LaO and/or a layer of Al and/or AlO on the plurality of dielectric films 130, 330 and 730 and then performing drive-in annealing, the work function tuning material (La and/or Al) is diffused. As a result, the thickness W23 of the dielectric film 730 may be larger than the thickness W24 of the dielectric film 830.

Figure 11:
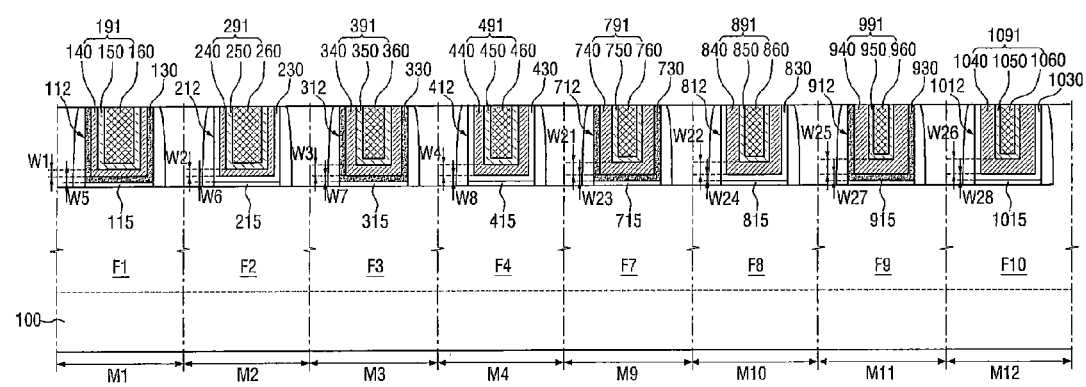
FIG. 11 is a cross-sectional view for illustrating a semiconductor device according to another example embodiment of the present disclosure.

FIG. 11 is a cross-sectional view for illustrating a semiconductor device according to another example embodiment of the present disclosure. For convenience of illustration, descriptions will be made focusing on the differences from those described above with respect to FIGS. 1 to 3 and FIG. 10.

Referring to FIG. 11, in contrast to the semiconductor device according to the previous example embodiment in which six fin-type transistors M1 to M4, M9 and M10 have different threshold voltages, in the semiconductor device according to the present example embodiment, eight fin-type transistors M1 to M4 and M9 to M12 have different threshold voltages.

The eleventh fin-type transistor M11 includes a ninth fin F9, a trench 912, an interface film 915, a dielectric film 930 and a metal gate 991. The metal gate 991 may include a work function metal film 940 of a first conductivity type (e.g., p-type), a work function metal film 950 of a second conductivity type (e.g., n-type), and a conductive pattern 960.

The twelfth fin-type transistor M12 includes a tenth fin F10, a trench 1012, an interface film 1015, a dielectric film 1030 and a metal gate 1091. The metal gate 1091 may include a work function metal film 1040 of a first conductivity type (e.g., p-type), a work function metal film 1050 of a second conductivity type (e.g., n-type), and a conductive pattern 1060.

A plurality of fins F1 to F4 and F7 to F10 may comprise the same material and may have the same thickness. A plurality of interface films 115, 215, 315, 415, 715, 815, 915 and 1015 may comprise the same material. A plurality of work function metal films 140, 240, 340, 440, 740, 840, 940 and 1040 may comprise the same material. A plurality of work function metal films 150, 250, 350, 450, 750, 850, 950 and 1050 may comprise the same material. However, this is merely illustrative.

In the semiconductor device according to the present example embodiment of the present disclosure, by way of adjusting thickness of at least some of the work function metal films 140, 240, 340, 440, 740, 840, 940 and 1040, and by way of doping work function tuning material into at least some of the dielectric films 130, 230, 330, 430, 730, 830, 930 and 1030, the plurality of work function metal films 140, 240, 340, 440, 740, 840, 940 and 1040 have different effective work functions. By doing so, the threshold voltages of the eight fin-type transistors M1 to M4 and M9 to M12 can be adjusted.

In this regard, the thickness relationship among the work function metal films 140, 240, 340, 440, 740, 840, 940 and 1040 of the first conductivity type is as follows: W1=W2<W3=W4<W21=W22<W25=W26. In addition, a work function tuning material (La and/or Al) is doped in the plurality of dielectric films 130, 330, 730 and 930 whereas no work function tuning material (La and/or Al) is doped in the plurality of dielectric films 230, 430, 830 and 1030.

Additionally, by forming a layer of La and/or LaO and/or a layer of Al and/or AlO on the plurality of dielectric films 130, 330, 730 and 930 and then performing drive-in annealing, the work function tuning material (La and/or Al) is diffused. As a result, the thickness W27 of the dielectric film 930 may be larger than the thickness W28 of the dielectric film 1030.

Although eight fin-type transistors M1 to M4 and M9 to M12 having different threshold voltages are illustrated in FIG. 11, the number of the fin-type transistors are not limited to eight. Namely, using the above-described schemes, nine or more fin-type transistors having different threshold voltages can be produced.

Figure 12:
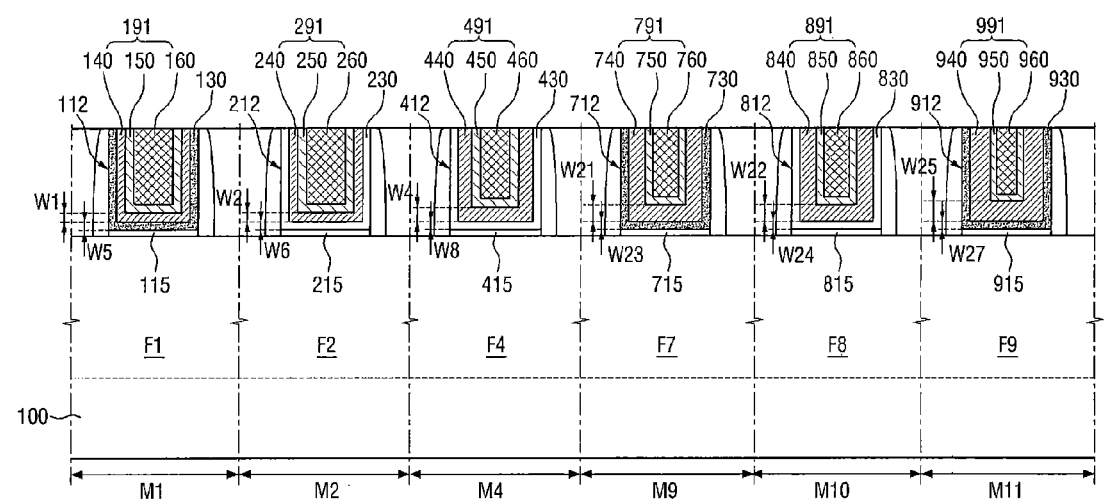
FIG. 12 is a cross-sectional view for illustrating a semiconductor device according to another example embodiment of the present disclosure.
Figure 13:
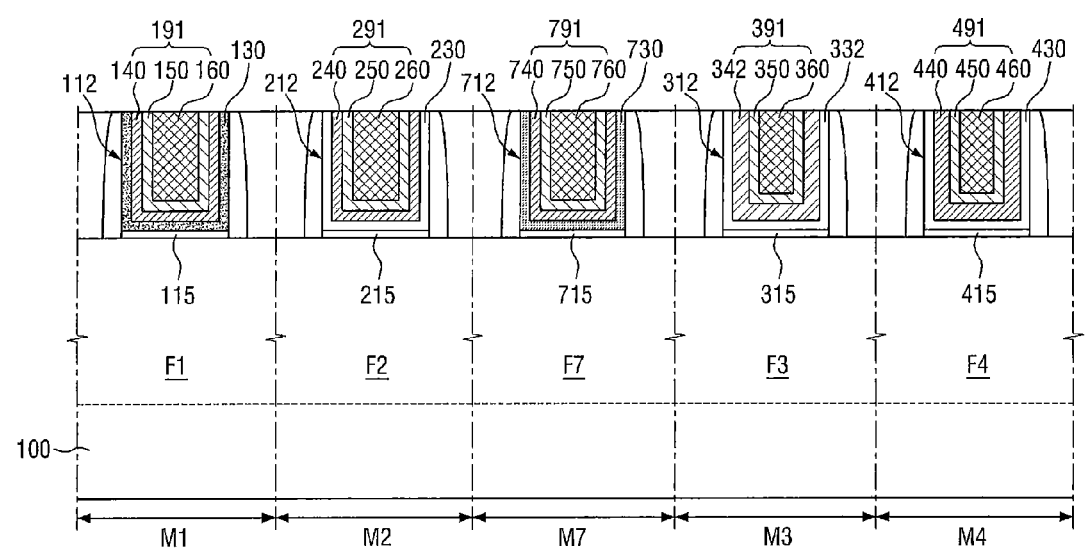
FIG. 13 is a cross-sectional view for illustrating a semiconductor device according to another example embodiment of the present disclosure.

By combining the schemes illustrated with respect to FIGS. 1 to 11, a plurality of fin-type transistors having different threshold voltages can be produced. FIGS. 12 and 13 illustrate examples of such combination. FIG. 12 is a cross-sectional view for illustrating a semiconductor device according to another example embodiment of the present disclosure. FIG. 13 is a cross-sectional view for illustrating a semiconductor device according to another example embodiment of the present disclosure.

Referring to FIG. 12, as an example, to make six fin-type transistors M1, M2, M4 and M9 to M11 having different threshold voltages, the thickness relationship among the work function metal films 140, 240, 440, 740, 840 and 940 of the first conductivity type is as follows: W1=W2<W4<W21=W22<W25. In addition, a work function tuning material (La and/or Al) may be doped in the plurality of dielectric films 130, 730 and 930 whereas no work function tuning material (La and/or Al) may be doped in the plurality of dielectric films 230, 430 and 830.

Referring to FIG. 13, as an example, to make five fin-type transistors M1, M2, M7, M3 and M4 having different threshold voltages, the dielectric film 130 of the fin-type transistor M1 is doped with La, the dielectric film 230 of the fin-type transistor M2 is doped with neither of La and Al, and the dielectric film 730 of the fin-type transistor M7 is doped with Al. Further, the thicknesses of the work function metal films 140, 240 and 740 of the first conductivity type of the fin-type transistors M1, M2 and M7, respectively, may be substantially equal to one another.

Further, the work function metal film 342 of the fin-type transistor M3 may have been subjected to hydrogen plasma doping whereas the work function metal film 440 of the fin-type transistor M4 may not have been subjected to hydrogen plasma doping. In the dielectric films 332 and 430 of the fin-type transistors M3 and M4, respectively, work function tuning material (La and/or Al) may not be doped.

FIGS. 14 to 21 are cross-sectional views for illustrating processes of a method of fabricating the semiconductor device according to the example embodiment of FIG. 10. As shown in FIG. 10, multiple layers of materials for dielectric films, metal gates and the like are to be stacked sequentially conforming to and within the trenches. However, the layers are shown as planar layers for convenience of illustration. In other embodiments, planar layers may be used.

Figure 14:
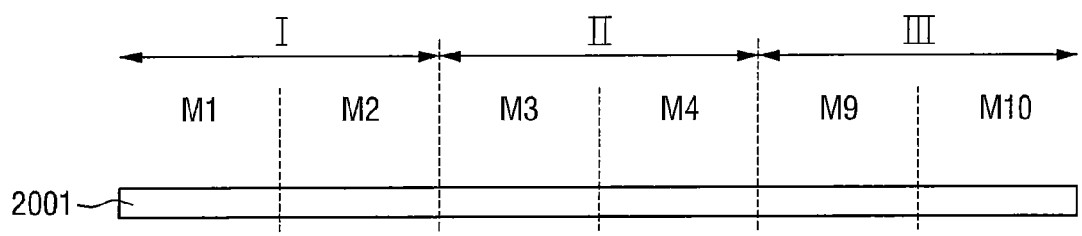
FIGS. 14 to 21 are cross-sectional views for illustrating processes of a method of fabricating the semiconductor device according to the example embodiment of FIG. 10.

Referring to FIG. 14, a first region I, a second region II and a third region III are defined in a substrate. In the first region I, fin-type transistors M1 and M2 are formed. In the second region II, fin-type transistors M3 and M4 are formed. In the third region III, fin-type transistors M9 and M10 are formed.

A dielectric film 2001 is formed in a plurality of trenches formed in the first to third regions I to III. The dielectric film 2001 may include a high-k dielectric insulation film made of, e.g., hafnium (Hf) and/or zirconium (Zr). The dielectric film 2001 may be formed by chemical vapor deposition (CVD) and/or atomic layer deposition (ALD), for example.

Figure 15:
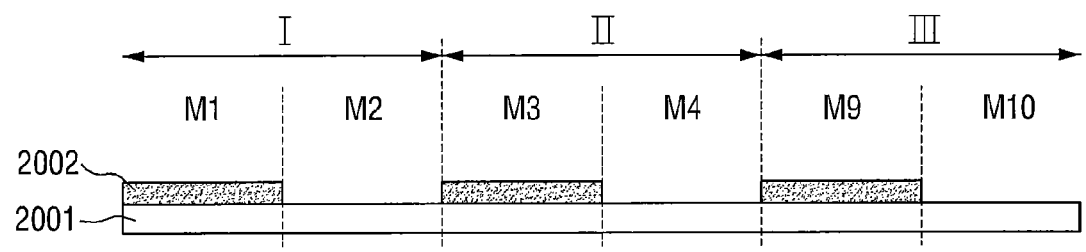

Referring to FIG. 15, a layer of work function tuning material 2002 is formed in the plurality of trenches formed in regions where the fin-type transistors M1, M3 and M9 are formed. The layer 2002 may be made of La and/or LaO and/or Al and/or AlO, for example, and may be formed by chemical vapor deposition (CVD) and/or atomic layer deposition (ALD), for example.

Figure 16:
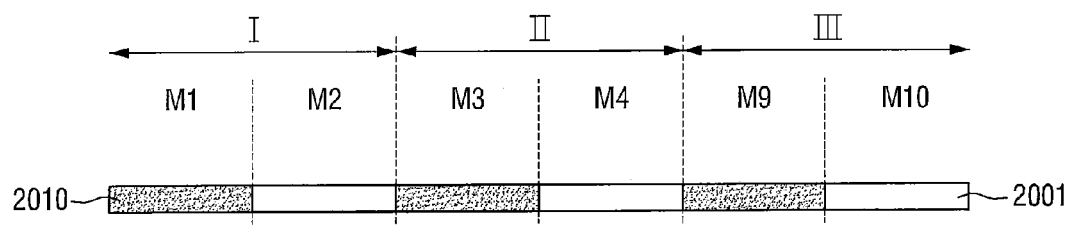

Referring to FIG. 16, drive-in annealing is performed, so that the work function tuning material (La and/or Al) can be diffused in the dielectric film 2010 in regions where the fin-type transistors M1, M3 and M9 are formed. In the dielectric film 2001 of the region where the fin-type transistors M2, M4 and M10 are formed, the work function tuning material (La and/or Al) is not diffused.

Figure 17:
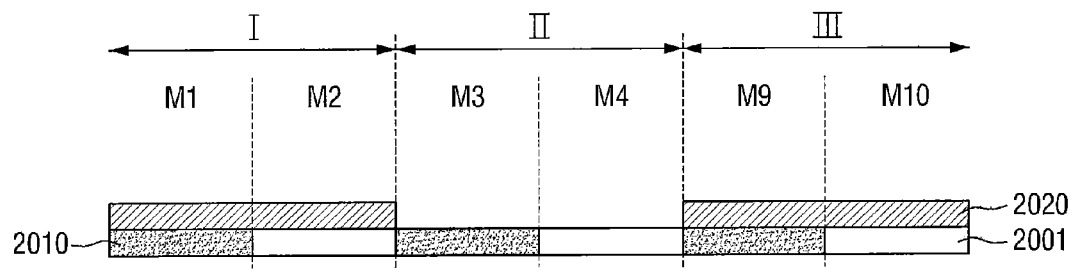

Referring to FIG. 17, a first conductive film 2020 of a first type is formed in the first region I and the third region III but not in the second region II. For example, the conductive film of the first type is formed in the first to third regions I to III and then the conductive film formed in the second region II is removed by etching.

Figure 18:
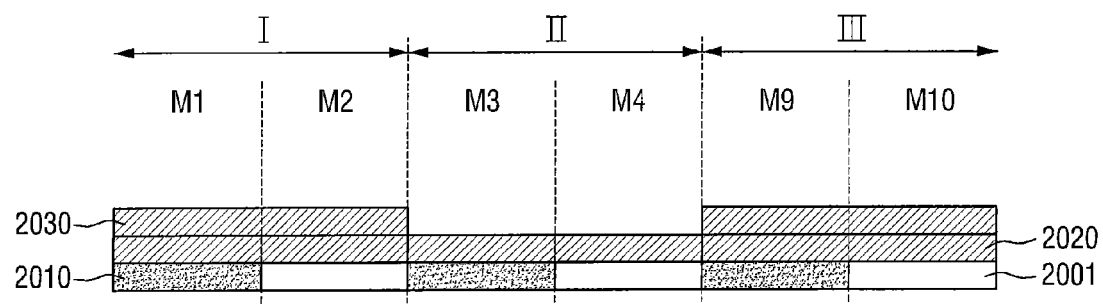

Referring to FIG. 18, a second conductive film 2030 of the first type is formed in the first region I to the third region III. Accordingly, the first conductive film 2020 and the second conductive film 2030 are stacked in the first region I and the third region III while only the second conductive film 2030 is stacked in the second region II.

Figure 19:
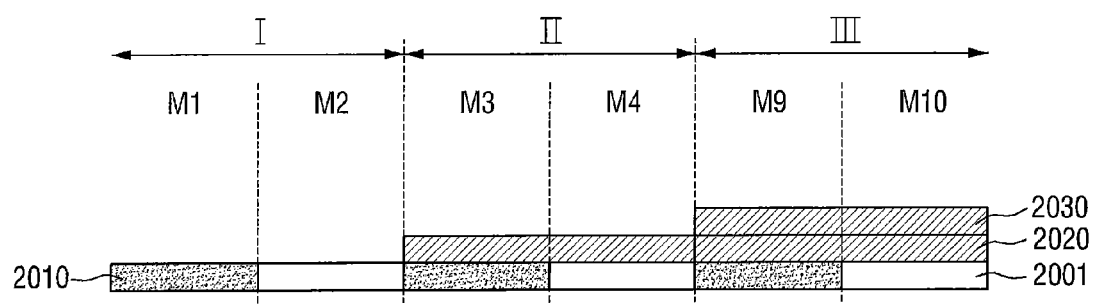

Referring to FIG. 19, the first conductive film 2020 and the second conductive film 2030 stacked in the first region I are removed by etching.

Figure 20:
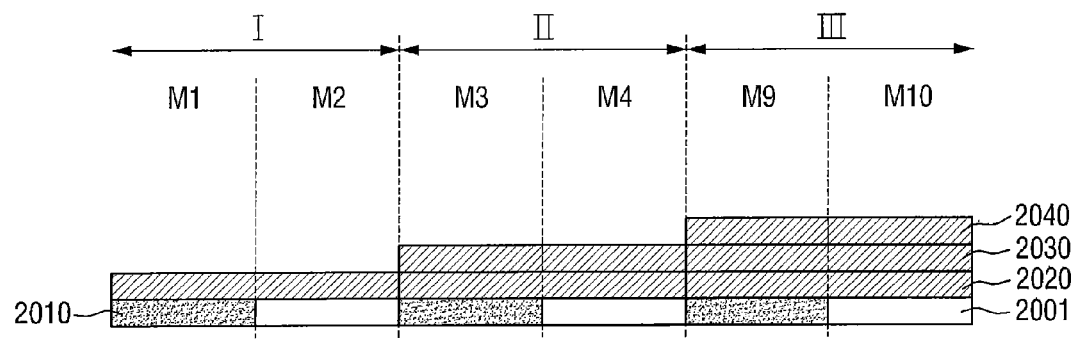

Referring to FIG. 20, a third conductive film 2040 of the first type is formed in the first region I to the third region III.

As a result, the third conductive film 2040 is stacked in the first region I, the second conductive film 2030 and the third conductive film 2040 are stacked in the second region II, and the first to third conductive films 2020 to 2040 are stacked in the third region III.

The first conductive film 2020 to the third conductive film 2040 may be work function tuning films of the same conductivity type (e.g., p-type). When the first to third conductive films are of a p-type work function tuning film, it may include, but is not limited to, binary metal nitride such as TiN and/or TaN, ternary metal nitride such as TiAlN, TaAlN, TiSiN and/or TaSiN, and/or oxidation of such metal nitride.

The first conductive film 2020 to the third conductive film 2040 may be the same material.

The work function metal films (140 and 240 of FIG. 10) formed in the first region I include the third conductive film 2040. The work function metal films (340 and 440 of FIG. 10) formed in the second region II include the second conductive film 2030 and the third conductive film 2040. The work function metal films (740 and 840 of FIG. 10) formed in the third region III include the first conductive film 2020 to third conductive film 2040. In this manner, differences in thickness between work function metal films (140, 240, 340, 440, 740 and 840 of FIG. 10) can be obtained.

Additionally, in this manner the dielectric films 2001 and 2010 in the first region I and second region II are exposed to etching only once. Specifically, the dielectric films 2001 and 2010 in the second region II may be exposed to the etching process in FIG. 17 and the dielectric films 2001 and 2010 in the first region I may be exposed to the etching process in FIG. 19. Accordingly, defects possibly occurring in the dielectric films 2001 and 2010 during the etching process can be reduced or minimized.

Figure 21:
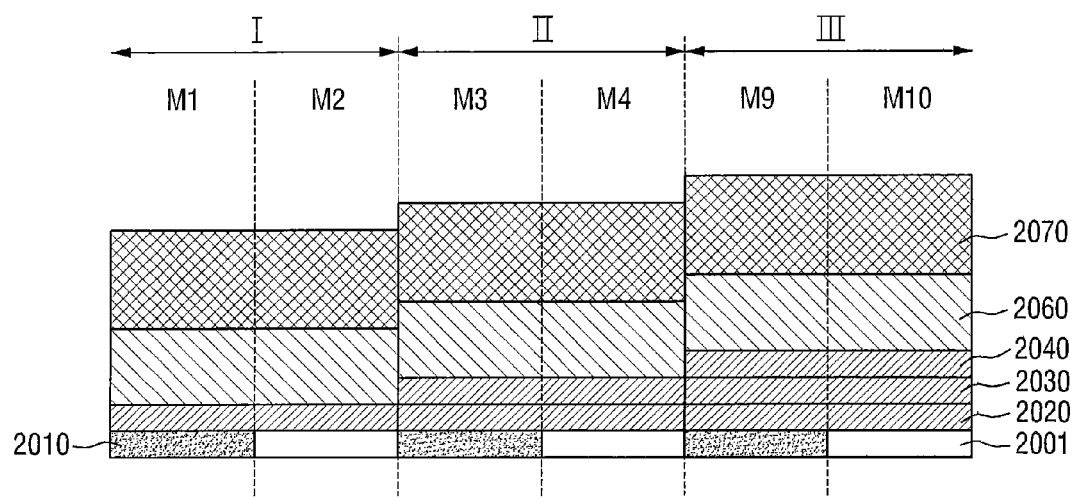

Referring to FIG. 21, a work function tuning film 2060 of a second conductivity type (e.g., n-type) is formed in the first to third regions I to III.

Subsequently, a conductive pattern 2070 is formed on the work function tuning film 2060 of the second conductivity type.

Although not shown in the drawings, a planarization process is performed to finish a plurality of metal gates (191, 291, 391, 491, 791 and 891 of FIG. 10).

FIGS. 22 to 31 are cross-sectional views for illustrating processes of a method of fabricating the semiconductor device according to the example embodiment of FIG. 11. As shown in FIG. 11, multiple layers of materials for dielectric films, metal gates and the like are to be stacked sequentially conforming to and within the trenches. However, the layers are shown as planar layers for convenience of illustration. In other embodiments, planar layers may be used.

Figure 22:
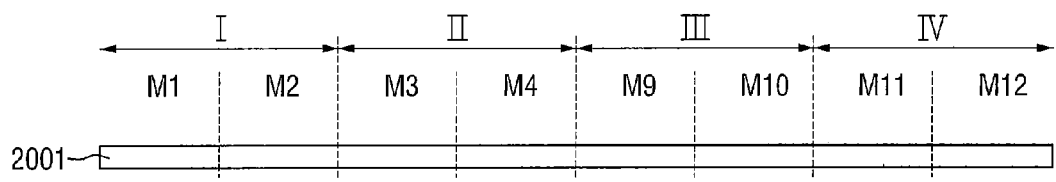
FIGS. 22 to 31 are cross-sectional views for illustrating processes of a method of fabricating the semiconductor device according to the example embodiment of FIG. 11.

Referring to FIG. 22, a first region I, a second region II, a third region III and a fourth region IV are defined in a substrate. In the first region I, fin-type transistors M1 and M2 are formed. In the second region II, fin-type transistors M3 and M4 are formed. In the third region III, fin-type transistors M9 and M10 are formed. In the third region IV, fin-type transistors M11 and M12 are formed.

A dielectric film 2001 is formed in a plurality of trenches formed in the first to fourth regions I to IV.

Figure 23:
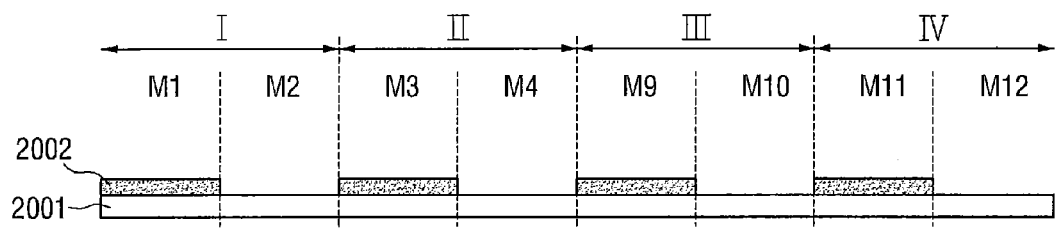

Referring to FIG. 23, a layer of work function tuning material 2002 is formed in the plurality of trenches formed in regions where the fin-type transistors M1, M3, M9 and M11 are formed.

Figure 24:
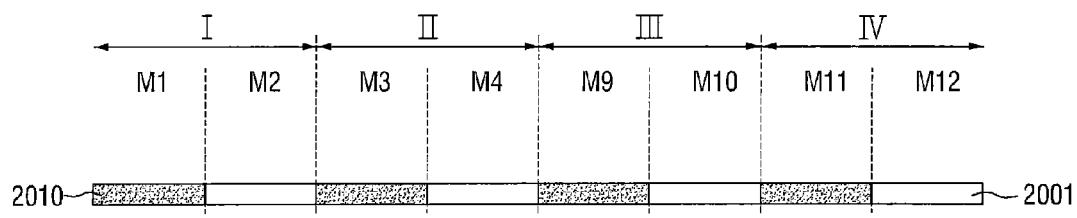

Referring to FIG. 24, drive-in annealing is performed, so that the work function tuning material (La and/or Al) can be diffused in the dielectric film 2010 in regions where the fin-type transistors M1, M3, M9 and M11 are formed. In the dielectric film 2001 in the region where the fin-type transistors M2, M4, M10 and M12 are formed, the work function tuning material (La and/or Al) is not diffused.

Figure 25:
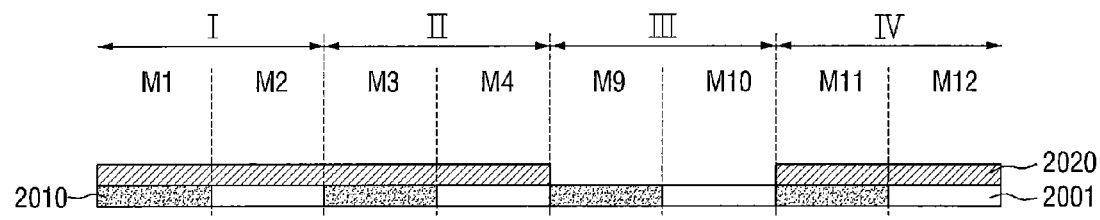

Referring to FIG. 25, a conductive film 2020 of a first type is formed in the first region I, in the second region II and the fourth region IV but not in the third region III. For example, the conductive film of the first type is formed in the first to fourth regions I to IV and then the conductive film formed in the third region III is removed by etching.

Figure 26:
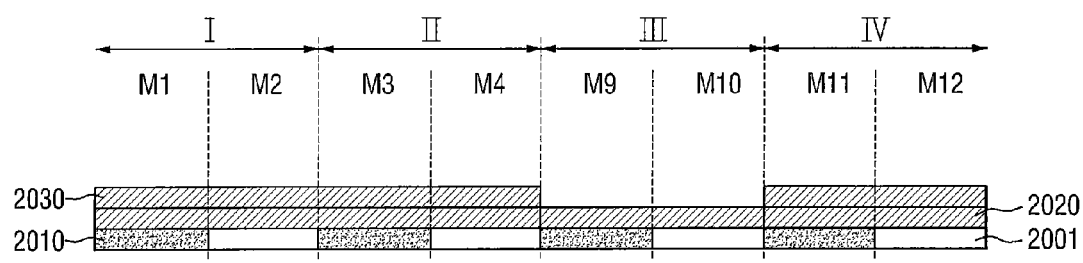

Referring to FIG. 26, a second conductive film 2030 of a first type is formed in the first region I to the fourth region IV. Accordingly, the first conductive film 2020 and the second conductive film 2030 are stacked in the first region I, the second region II and the fourth region IV while only the second conductive film 2030 is stacked in the third region III.

Figure 27:
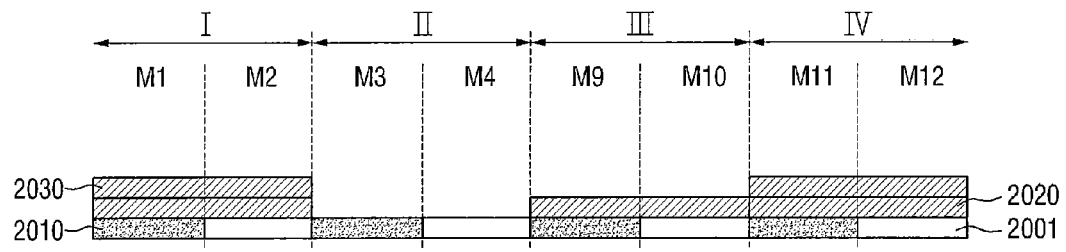

Referring to FIG. 27, the first conductive film 2020 and the second conductive film 2030 stacked in the second region II are removed by etching.

Figure 28:
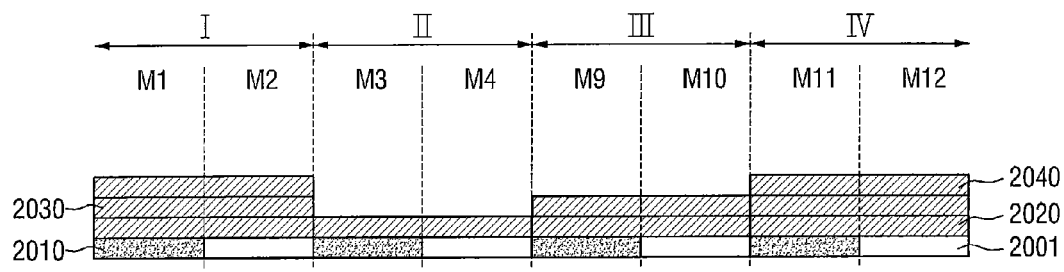

Referring to FIG. 28, a third conductive film 2040 of the first type is formed in the first region I to the fourth region IV. As a result, the first to third conductive film 2020 to 2040 are stacked in the first region I, only the third conductive film 2040 is formed in the second region II, the second conductive film 2030 and the third conductive film 2040 are formed in the third region III, and the first to third conductive films 2020 to 2040 are stacked in the fourth region IV.

Figure 29:
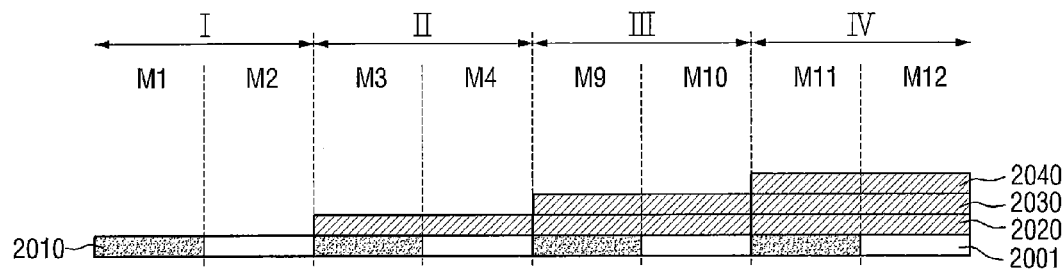

Referring to FIG. 29, the first conductive film 2020 to the fourth conductive film 2040 stacked in the first region I are removed by etching.

Figure 30:
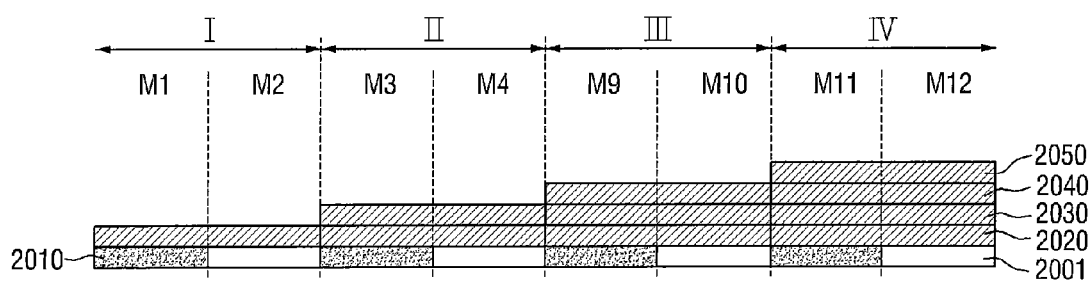

Referring to FIG. 30, a fourth conductive film 2050 of the first type is formed in the first region I to the fourth region IV. As a result, only the fourth conductive film 2050 is stacked in the first region I, the third conductive film 2040 and the fourth conductive film 2050 are stacked in the second region II, the second conductive film 2030 to the fourth conductive film 2050 are stacked in the third region III, and the first to fourth conductive films 2020 to 2050 are stacked in the fourth region IV.

As described above, the first conductive film 2020 to the fourth conductive film 2050 may be work function tuning films of the same conductivity type (e.g., p-type). The first conductive film 2020 to the fourth conductive film 2050 may be the same material.

The work function metal films (140 and 240 of FIG. 11) formed in the first region I include the fourth conductive film 2050. The work function metal films (340 and 440 of FIG. 11) formed in the first region II include the third conductive film 2040 and the fourth conductive film 2050. The work function metal films (740 and 840 of FIG. 11) formed in the third region III include the second conductive film 2030 to the fourth conductive film 2050. The work function metal films (940 and 1040 of FIG. 11) formed in the fourth region IV include the first conductive film 2020 to the fourth conductive film 2050. In this manner, differences in thickness between work function metal films (140, 240, 340, 440, 740, 840, 940 and 1040 of FIG. 11) can be obtained.

Figure 31:
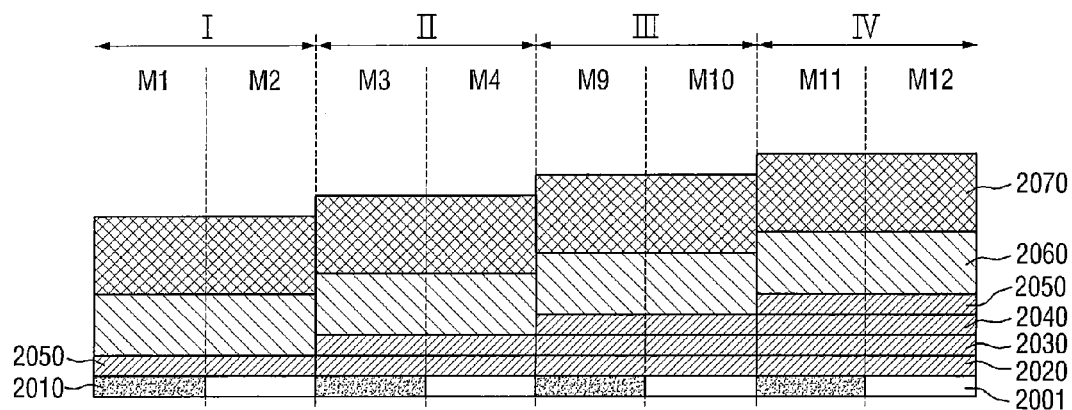

Referring to FIG. 31, a work function tuning film 2060 of a second conductivity type (e.g., n-type) is formed in the first to fourth regions I to IV.

Subsequently, a conductive pattern 2070 is formed on the work function tuning film 2060 of the second conductivity type.

Although not shown in the drawings, a planarization process is performed to finish a plurality of metal gates (191, 291, 391, 491, 791, 891, 991 and 1091 of FIG. 11).

Figure 32:
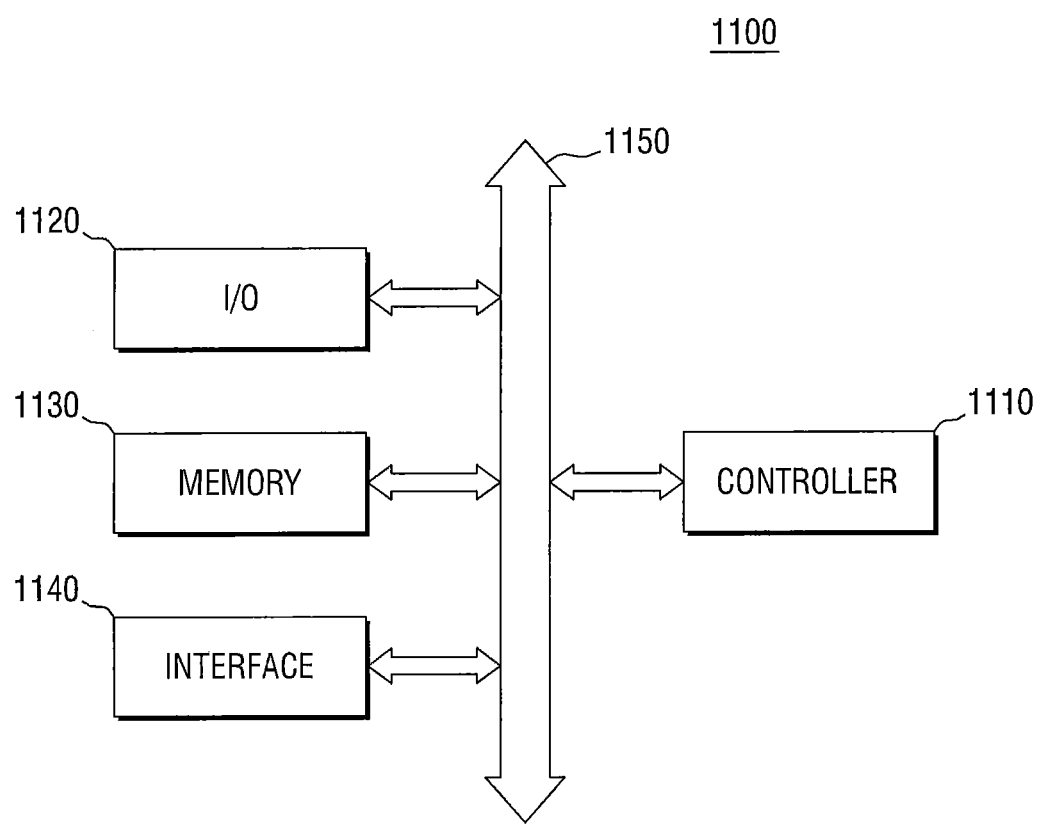
FIG. 32 is a block diagram of an electronic system including the semiconductor device according to some example embodiments of the present disclosure.

FIG. 32 is a block diagram of an electronic system including the semiconductor device according to some example embodiments of the present disclosure. The electronic system of FIG. 32 is an example system to which the semiconductor device described above with respect to FIGS. 1 to 11 can be applied.

Referring to FIG. 32, the electronic system 1100 according to an example embodiment of the present disclosure may include a controller 1110, an I/O (input/output) device 1120, a memory device 1130, an interface 1140 and a bus 1150. The controller 1110, the I/O device 1120, the memory device 1130 and/or the interface 1140 may be connected to one another via the bus 1150. The bus 1150 may serve as a path via which data is transferred.

The controller 1110 may include a microprocessor, a digital signal processor, a microcontroller and/or logic elements capable of performing similar functions. The I/O device 1120 may include a keypad, a keyboard, a display device, etc. The memory device 1130 may store therein data and/or instructions, for example. The interface 1140 may be capable of transmitting/receiving data to/from a communication network. The interface 1140 may be a wired and/or wireless interface. For example, the interface 1140 may include an antenna, a wired/wireless transceiver or the like. Although not shown in FIG. 32, the electronic system 1100 may be an operational memory for improving the operation of the controller 1100 and may further include a high-speed DRAM and/or SRAM, for example. Additionally, the semiconductor device according to some example embodiments of the present disclosure may be provided in the memory device 1130 or may be provided as a part of the controller 1110, the I/O device 1120 and/or the interface 1140, for example.

The electronic system 1100 may be applied to a PDA (personal digital assistant), a portable computer, a web tablet, a wireless phone, a mobile phone, a digital music player, a memory card and/or any electronic device capable of transmitting/receiving information in wireless environment.

While the present disclosure has been particularly shown and described with reference to example embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the inventive concepts.

What is claimed is:

1. A semiconductor device comprising:
   a first fin-type transistor comprising a first fin, a first trench on the first fin, a first dielectric film extending along inner walls of the first trench and a first work function metal film on the first dielectric film in the first trench, the first work function metal film being of a first conductivity type;
   a second fin-type transistor comprising a second fin, a second trench on the second fin, a second dielectric film extending along inner walls of the second trench and a second work function metal film on the second dielectric film in the second trench, the second work function metal film being of the first conductivity type; and
   a third fin-type transistor comprising a third fin, a third trench on the third fin, a third dielectric film extending along inner walls of the third trench and a third work function metal film on the third dielectric film in the third trench, the third work function metal film being of the first conductivity type,
   wherein the first dielectric film comprises a work function tuning material and the second dielectric film does not comprise the work function tuning material, and
   wherein a first thickness of the first work function metal film is different from a third thickness of the third work function metal film.

2. The semiconductor device of claim 1, wherein the first fin-type transistor to the third fin-type transistor have different threshold voltages.

3. The semiconductor device of claim 1, wherein the work function tuning material comprises lanthanum (La) and/or aluminum (Al).

4. The semiconductor device of claim 1, wherein the first dielectric film is thicker than the second dielectric film.

5. The semiconductor device of claim 1, wherein the first thickness of the first work function metal film is substantially equal to a second thickness of the second work function metal film.

6. The semiconductor device of claim 1, wherein the third dielectric film comprises the work function tuning material, the semiconductor device further comprising:
   a fourth fin-type transistor comprising a fourth fin, a fourth trench on the fourth fin, a fourth dielectric film extending along inner walls of the fourth trench and a fourth work function metal film on the fourth dielectric film in the fourth trench, the fourth work function metal film being of the first conductivity type,
   wherein the fourth dielectric film does not comprise the work function tuning material, and wherein a fourth thickness of the fourth work function metal film is substantially equal to the third thickness.

7. The semiconductor device of claim 1, further comprising:
   an eleventh work function metal film on the first work function metal film, in the first trench, the eleventh work function metal film being of a second conductivity type;
   a twelfth work function metal film on the second work function metal film in the second trench, the twelfth work function metal film being of the second conductivity type; and
   a thirteenth work function metal film on the third work function metal film in the third trench, the thirteenth work function metal film being of the second conductivity type.

8. The semiconductor device of claim 1, further comprising:
   a fifth fin-type transistor comprising a fifth fin, a fifth trench on the fifth fin, a fifth dielectric film extending along inner walls of the fifth trench and a fifth work function metal film on the fifth dielectric film in the fifth trench, the fifth work function metal film being of a second conductivity type,
   wherein a work function metal film of the first conductivity type is not disposed between the fifth dielectric film and the fifth work function metal film.

9. The semiconductor device of claim 8, further comprising:
   a sixth fin-type transistor comprising a sixth fin, a sixth trench on the sixth fin, a sixth dielectric film extending along inner walls of the sixth trench and a sixth work function metal film on the sixth dielectric film in the sixth trench, the sixth work function metal film being of the second conductivity type,
   wherein a work function metal film of the first conductivity type is not disposed between the sixth dielectric film and the sixth work function metal film, and
   wherein the fifth dielectric film comprises the work function tuning material and the sixth dielectric film does not comprise the work function tuning material.

10. The semiconductor device of claim 1, further comprising:
    a first protection film and a first etch stop layer disposed between the first dielectric film and the first work function metal film;
    a second protection film and a second etch stop layer disposed between the second dielectric film and the second work function metal film; and
    a third protection film and a third etch stop layer disposed between the third dielectric film and the third work function metal film.

11. The semiconductor device of claim 1
    wherein an oxygen concentration in the first work function metal film is lower than an oxygen concentration in the second work function metal film.

12. The semiconductor device of claim 11, wherein the oxygen concentration in the first work function metal film is substantially equal to an oxygen concentration in the third work function metal film.

13. A semiconductor device comprising:
    a substrate;
    a first transistor on the substrate, the first transistor comprising a first gate dielectric film and a first work function metal film on the first gate dielectric film, the first work function metal film being of a first conductivity type;
    a second transistor on the substrate, the second transistor comprising a second gate dielectric film and a second work function metal film on the second gate dielectric film, the second work function metal film being of the first conductivity type; and a third transistor on the substrate, the third transistor comprising a third gate dielectric film and a third work function metal film on the third gate dielectric film, the third work function metal film being of the first conductivity type, wherein the first gate dielectric film comprises a work function tuning material and the second gate dielectric film does not comprise the work function tuning material, and wherein a first thickness of the first work function metal film is different from a third thickness of the third work function metal film.

14. The semiconductor device of claim 13, wherein the first transistor to the third transistor have different threshold voltages.

15. The semiconductor device of claim 13, wherein an effective work function of the first work function metal film, an effective work function of the second work function metal film and an effective work function of the third work function metal film are different from one another.

16. The semiconductor device of claim 13, wherein the third gate dielectric film comprises the work function tuning material, the semiconductor device further comprising:

a fourth transistor on the substrate, the fourth transistor comprising a fourth gate dielectric film and a fourth work function metal film on the fourth gate dielectric film, the fourth work function metal film being of the first conductivity type, wherein the fourth gate dielectric film does not comprise the work function tuning material, and wherein a fourth thickness of the fourth work function metal film is about equal to the third thickness.

17. The semiconductor device of claim 13, further comprising:

an eleventh work function metal film on the first work function metal film, the eleventh work function metal film being of a second conductivity type;

a twelfth work function metal film on the second work function metal film, the twelfth work function metal film being of the second conductivity type; and a thirteenth work function metal film on the third work function metal film, the thirteenth work function metal film being of the second conductivity type.

18. The semiconductor device of claim 13, further comprising:

a fifth transistor on the substrate, the fifth transistor comprising a fifth gate dielectric film and a fifth work function metal film on the fifth gate dielectric film, the fifth work function metal film being of a second conductivity type, wherein a work function metal film of the first conductivity type is not disposed between the fifth gate dielectric film and the fifth work function metal film.

19. The semiconductor device of claim 1, wherein the first fin-type transistor is of a same conductivity type as the third fin-type transistor.

20. The semiconductor device of claim 13, wherein the first transistor is of a same conductivity type as the third transistor.

* * * * *